(12) United States Patent
Bleske

(10) Patent No.: US 10,672,684 B2
(45) Date of Patent: Jun. 2, 2020

(54) HEAT SINK HOLD DOWN SYSTEM FOR DIRECT ATTACHMENT TO PRINTED CIRCUIT BOARD

(71) Applicant: CISCO TECHNOLOGY, INC., San Jose, CA (US)

(72) Inventor: Randy J. Bleske, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/154,527

(22) Filed: Oct. 8, 2018

(65) Prior Publication Data
US 2020/0111723 A1 Apr. 9, 2020

(51) Int. Cl.
| | |
|---|---|
| *H01L 23/40* | (2006.01) |
| *H05K 1/02* | (2006.01) |
| *H01R 13/24* | (2006.01) |
| *H05K 7/20* | (2006.01) |

(52) U.S. Cl.
CPC ..... *H01L 23/4093* (2013.01); *H01R 13/2421* (2013.01); *H01R 13/2471* (2013.01); *H05K 1/021* (2013.01); *H05K 7/2049* (2013.01); *H01L 2023/4062* (2013.01); *H01L 2023/4087* (2013.01); *H05K 2201/066* (2013.01)

(58) Field of Classification Search
CPC ....... H01L 23/4093; H01L 2224/48227; H01L 23/467; H01L 23/3672; H01L 2023/4087; H01L 2023/405; H01L 2023/4062; H01L 23/40; H05K 7/20418; H05K 2201/066; H05K 7/2049
See application file for complete search history.

(56) References Cited

U.S. PATENT DOCUMENTS

| | | | | |
|---|---|---|---|---|
| 5,357,404 A | * | 10/1994 | Bright | H01L 23/4093 174/381 |
| 5,477,916 A | * | 12/1995 | Lin | H01L 23/4093 165/185 |
| 5,493,475 A | * | 2/1996 | Lin | H01L 23/4006 165/185 |
| 5,615,735 A | * | 4/1997 | Yoshida | H01L 23/4093 165/80.3 |
| 6,112,378 A | * | 9/2000 | Lee | F16B 5/065 165/80.3 |
| 6,180,874 B1 | * | 1/2001 | Brezina | H01L 23/4093 165/80.3 |
| 6,219,244 B1 | * | 4/2001 | Chen | H01L 23/4093 165/185 |
| 6,273,185 B1 | * | 8/2001 | Lin | H01L 23/4093 165/185 |
| 6,496,371 B2 | * | 12/2002 | Winkel | H01L 23/4093 248/510 |

(Continued)

*Primary Examiner* — Adam B Dravininkas
(74) *Attorney, Agent, or Firm* — Cindy Kaplan

(57) ABSTRACT

In one embodiment, an apparatus for holding down a heat sink on a printed circuit board comprises a pair of hold down clips, each of the hold down clips comprising a first end for attachment to the heat sink, a resiliently compressible arm, and a retaining finger at a second end for insertion into an opening in the printed circuit board. The retaining finger is configured to exert a spring force against a lower surface of the printed circuit board when inserted into the opening to securely hold down the heat sink on an upper surface of the printed circuit board.

20 Claims, 7 Drawing Sheets

(56) References Cited

U.S. PATENT DOCUMENTS

| | | | |
|---|---|---|---|
| 6,518,507 B1* | 2/2003 | Chen | H01L 23/4093 165/80.3 |
| 7,136,287 B2* | 11/2006 | Yang | H01L 23/4093 361/704 |
| 7,333,338 B2* | 2/2008 | Lai | H01L 23/4093 165/185 |
| 9,560,736 B2 | 1/2017 | Dang et al. | |
| 2001/0030037 A1* | 10/2001 | Hellbruck | H01L 23/4093 165/80.3 |
| 2009/0200660 A1 | 8/2009 | Awad et al. | |
| 2010/0321894 A1 | 12/2010 | Wang et al. | |
| 2011/0141699 A1* | 6/2011 | Hager | H05K 3/308 361/720 |
| 2012/0120606 A1* | 5/2012 | Lin | F16B 5/121 361/704 |
| 2012/0327606 A1* | 12/2012 | Tang | H01L 23/4093 361/720 |
| 2013/0155623 A1* | 6/2013 | Ma | H01L 23/4093 361/720 |
| 2014/0036451 A1* | 2/2014 | Simon | H01L 23/4093 361/720 |
| 2018/0235104 A1 | 8/2018 | Harris et al. | |

* cited by examiner

HEAT SINK HOLD DOWN SYSTEM FOR DIRECT ATTACHMENT TO PRINTED CIRCUIT BOARD

TECHNICAL FIELD

The present disclosure relates generally to heat sinks, and more particularly, to heat sink installation on a printed circuit board.

BACKGROUND

Over the past several years, there has been a tremendous increase in the need for higher performance communications networks. Increased performance requirements have led to an increase in energy use resulting in greater heat dissipation from components. Heat sinks are widely used to accommodate the large thermal dissipation of many semiconductor devices. In order to mount heat sinks to printed circuit boards, screws, clips, or other components are needed for secure attachment of the heat sink to the printed circuit board.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
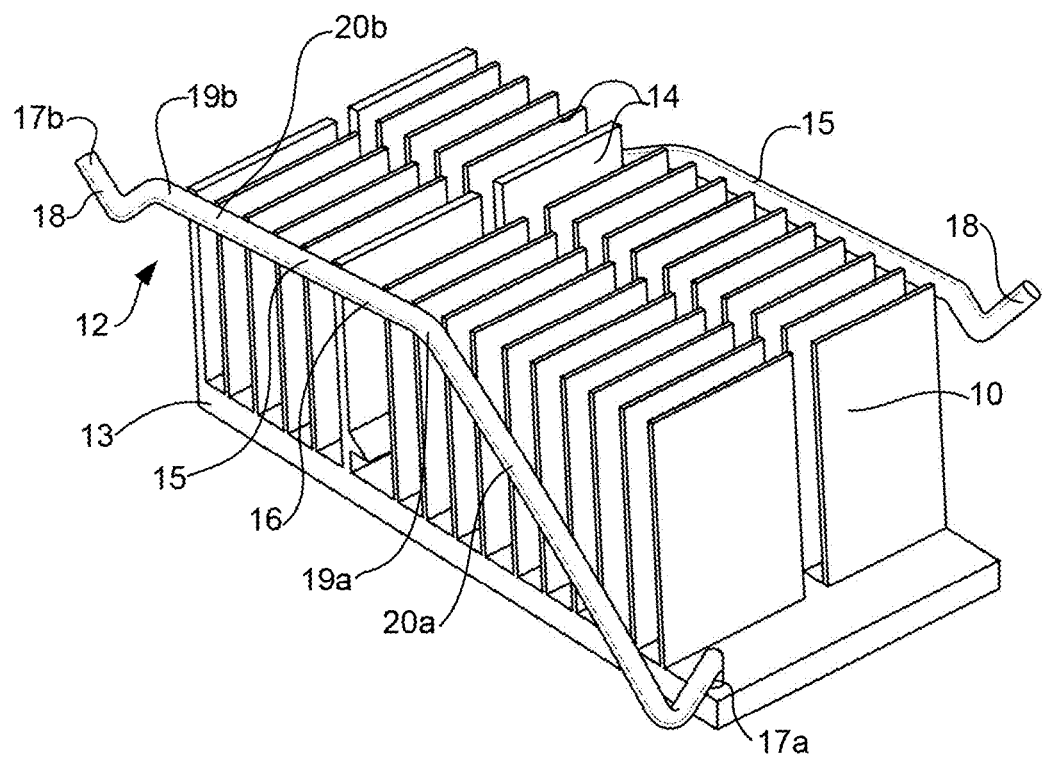
FIG. 1A is a perspective of a heat sink and heat sink hold down system, in accordance with one embodiment.

In one embodiment, an apparatus for holding down a heat sink on a printed circuit board generally comprises a pair of hold down clips, each of the hold down clips comprising a first end for attachment to the heat sink, a resiliently compressible arm, and a retaining finger at a second end for insertion into an opening in the printed circuit board. The retaining finger is configured to exert a spring force against a lower surface of the printed circuit board when inserted into the opening to securely hold down the heat sink on an upper surface of the printed circuit board.

In another embodiment, an apparatus generally comprises a heat sink and a hold down clip comprising a first end attached to the heat sink and a second end for insertion into an opening in a printed circuit board. The hold down clip is resiliently compressible for insertion into the opening in the printed circuit board and configured to exert a spring force against a lower surface of the printed circuit board when inserted into the opening to hold down the heat sink on an upper surface of the printed circuit board.

In yet another embodiment, a system generally comprises a printed circuit board comprising at least one opening extending therethrough, a heat sink, and a hold down clip comprising a first end for attachment to the heat sink and a second end for insertion into the opening in the printed circuit board. The hold down clip is resiliently compressible for insertion into the opening in the printed circuit board and exerts a spring force against a lower surface of the printed circuit board when inserted into the opening to hold down the heat sink on an upper surface of the printed circuit board.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Heat sink installation on a printed circuit board typically involves use of screws, clips, or other hardware components and often requires use of tie down elements for attachment to the printed circuit board. The heat sink installation may also require access to a lower surface of the printed circuit board if mounting hardware cannot be installed from an upper surface. Another drawback with conventional heat sink installation is the space required on the printed circuit board to attach the heat sink. For example, openings that extend through the printed circuit board may be needed to receive components used to attach the heat sink to the printed circuit board. These openings use valuable circuit routing space in critical areas adjacent to high density semiconductors that may need extensive traces. The openings may limit the electronics or features that can be incorporated into a fixed size printed circuit board and may impact integrity of the printed circuit board by causing structural weakness, and therefore, should be optimized in size to minimize impact to the printed circuit board layout and design.

The embodiments described herein provide a heat sink hold down system with a reduced number of mounting components, and corresponding openings in the printed circuit board that may be optimized in size to minimize impact to the printed circuit board. One or more embodiments reduce printed circuit board space requirements for heat sink attachment, eliminate additional mounting components, eliminate need for access from a lower surface of the printed circuit board, and optimize installation and assembly processes, thereby reducing installation time and costs.

Figure 1B:
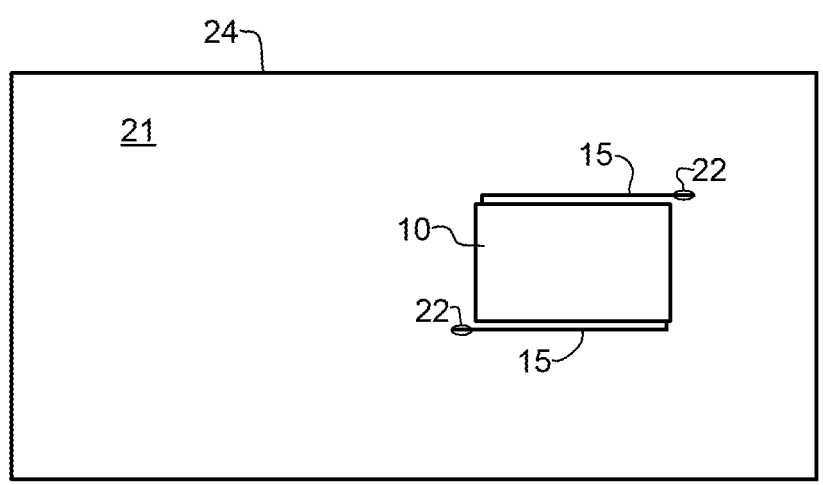
FIG. 1B is a top schematic view of the heat sink attached to a printed circuit board with the heat sink hold down system of FIG. 1A.

Referring now to the drawings, and first to FIGS. 1A and 1B, a heat sink 10 and heat sink hold down system, generally indicated at 12, are shown, in accordance with one embodiment. The heat sink 10 is configured to maximize the surface area in contact with a cooling medium (e.g., air) surrounding the heat sink. The heat sink 10 transfers heat generated by an electronic component such as a semiconductor device where heat dissipation capability of the component is insufficient to moderate its temperature. In the example shown in FIG. 1A, the heat sink includes a base 13 and fins 14, which allow excess thermal energy to dissipate into the environment by radiation and convection. The heat sink 10 may be formed from any suitable material (e.g., copper, aluminum) and have any shape (e.g., any height, width, length, base footprint, base thickness, number of fins, size of fins).

As shown in FIG. 1B, the heat sink 10 may be attached to a printed circuit board 24 comprising any number of electronic components (not shown) and formed from any suitable material. The printed circuit board 24 provides a dielectric material for copper or other conductive traces. The traces and pads are embedded within or deposited on the printed circuit board 24 for connection with the electronic components. Etching, deposition, bonding, or other processes may be used to form the traces, pads, or embedded components (e.g., passive or active devices). The printed circuit board 24 may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). Vias may be provided for routing traces through layers of the printed circuit board. The traces, pads, and electronic components may be arranged in any configuration to perform any number of functions (e.g., network server card, graphics card, motherboard, device card, and the like), or any other electronic part of a computer, router, switch, server, or other network device.

One or more heat sinks 10 may be attached to the printed circuit board 24 and positioned, for example, over one or more heat generating devices. The heat sink 10 may be attached to the printed circuit board 24 for operation on any type of network device (e.g., router, switch, server, workstation, gateway, controller, edge device, access device, aggregation device, core node, intermediate node, or other network device). The network device may operate in the context of a data communications network including multiple network devices that communicate over one or more networks.

It is to be understood that the heat sink 10 and printed circuit board 24 described above are only examples and that the heat sink hold down system described herein may be used to attach any type of heat sink or other component to any substrate supporting electronic components.

In the example shown in FIGS. 1A and 1B, the heat sink hold down system 12 comprises two hold down clips 15. Each clip comprises a compressible resilient arm 16 extending from a first end 17a configured for attachment to the heat sink 10 to a second end 17b comprising a retaining finger 18 for insertion directly into an opening 22 in the printed circuit board 24 for securely retaining (holding down) the heat sink on an upper surface 21 of the printed circuit board (e.g., mounted over a semiconductor chip or other heat generating device). As described below with respect to FIGS. 2, 4, and 6, the retaining finger of the hold down clip may have different configurations (e.g., shape, size, diameter, width) based on the corresponding shape and size of the opening in the printed circuit board (e.g., as shown in FIGS. 3, 5, and 7).

The arm 16 is configured to be resiliently compressed between the two ends 17a, 17b in a generally downward and longitudinal direction and spring back towards its original state after insertion of the retaining finger 18 into the opening 22 in the printed circuit board 24. Release of the compressed hold down clip 15 after insertion into the opening 22 causes the arm 16 to spring back towards its original unloaded position, resulting in the retaining finger 18 applying a spring force on the printed circuit board to securely hold the heat sink 10 in place, as described below with respect to FIGS. 2, 4, and 6.

The arm 16 may be formed from a metal wire, for example, and comprises one or more sections connected through one or more bends to provide a compressible (bendable) member. In the example shown in FIG. 1A, the resilient arm 16 comprises a first generally straight section 20a angled upward from the attachment point at the first end 17a of the hold down clip 15 and a second section 20b extending from a bend 19a generally parallel to the heat sink base 13 when the arm 16 is in its unrestrained position (FIG. 1A). The retaining finger 18 is angled downward from section 20b at bend 19b and may be formed in different shapes (e.g., L-shape (FIG. 2), J-shape (FIG. 4), pin head (FIG. 6)) to correspond to different size and shape openings in the printed circuit board. The bends 19a, 19b and straight sections 20a, 20b form a compressible (spring) member that may be sufficiently compressed and manipulated to rotate the retaining finger 18 downward and insert the retaining finger into the opening 22 in the printed circuit board 24, while providing sufficient spring force when held within the opening to hold down the heat sink on the printed circuit board. Once the arm 16 is released after insertion of the retaining finger 18 into the opening 22, the hold down clip 15 moves towards its unloaded position and exerts a spring force against a lower surface of the printed circuit board 24 to retain the heat sink 10 securely mounted on the upper surface 21 of the printed circuit board. As previously described, one or more electronic components may be interposed between the printed circuit board 24 and heat sink 10.

It is to be understood that the shape of the arm 16 shown in FIG. 1A is only an example and that the arm may comprise other shapes (e.g., different angles or number of bends or sections, or formed from one or more curved sections).

A wire forming the hold down clip 15 may be formed from any suitable material and have a diameter that is sized to provide the above described resiliency and spring force. The diameter of the hold down clip 15 may be uniform along the length of the clip (e.g., arm 16 and retaining finger 18) or may vary from one section 20a to another section 20b, or vary between the arm 16 and the retaining finger 18. For example, as described below with respect to FIG. 2, the retaining finger 18 may be flattened to fit within a narrow slot opening.

In the example shown in FIGS. 1A and 1B, the two hold down clips 15 are attached to opposite corners of the heat sink base 13 and extend generally longitudinally along an outer edge of the heat sink 10 for attachment to the printed circuit board 24 at locations adjacent to the remaining two opposite corners of the heat sink. The first end 17a of the hold down clip may be inserted into an opening formed in the base 13 (or other area of the heat sink (e.g., fin 14)) and retained by any suitable means or may be welded to the heat sink or integrally formed with the heat sink. The first end 17a of the hold down clip 15 may be fixedly attached or rotatably attached to the heat sink and may be permanently attached or removably attached. The hold down clip 15 may be attached to the heat sink at or near an edge or corner of the heat sink as shown in FIG. 1B or attached at another location of the heat sink, as long as sufficient force is provided to prevent movement of the heat sink relative to the printed circuit board 24. As noted below, the hold down system 12 may comprise a different number of hold down clips 15 than shown in FIGS. 1A and 1B, in which case, the attachment point may be at a location other than a corner of the heat sink 10.

In the example shown in FIGS. 1A and 1B, one hold down clip 15 extends in a forward direction and the other hold down clip extends in an opposite rearward direction along a side of the heat sink (generally parallel to the heat sink). It is to be understood that this is only an example and the hold down system may comprise any number of hold down clips (e.g., 1, 2, or more than 2) for securely attaching the heat sink 10 to the printed circuit board 24 with a corresponding number of openings. For example, rather than extending along an edge of the heat sink 10, one or more hold down clips may be configured to extend over the length (longitudinally) or width (laterally) of the heat sink or extend diagonally over the heat sink.

The openings 22 in the printed circuit board 24 are located at positions corresponding to the locations of the free end 17b (retaining finger 18) of the hold down clip 15. For example, the printed circuit board 24 configured for receiving the heat sink 10 and hold down system 12 shown in FIG. 1B includes two openings 22 located adjacent to opposite corners of the heat sink for receiving the retaining fingers 18 of the hold down clips 15.

As described below with respect to FIGS. 3, 5, and 7, the openings (holes) extend through the printed circuit board and may have various shapes and sizes for receiving different shapes or sizes of retaining fingers. The openings may be etched, drilled, sawed, cut, or otherwise formed in the substrate of the printed circuit board and preferably extend through the printed circuit board. The openings may be bare, plated, or include an insert. The insert may be metal, plastic, or any other suitable material for providing structural reinforcement and may provide a bearing surface for the spring loaded retaining finger. Examples of shapes and sizes for the openings in the printed circuit board are shown and described below with respect to FIGS. 3, 5, and 7.

As previously noted, smaller openings are preferred to reduce impact to valuable printed circuit board space for routing traces, thus, the shape and size of the retaining finger and corresponding opening in the printed circuit board may be optimized to reduce the size of the opening. However, if openings are already formed in the printed circuit board for receiving other types of clips (e.g., multiple piece clip and tie down), the hold down clips 15 may be configured to fit within existing slots for backward compatibility. The opening formed in the printed circuit board may be oblong, round, rectangular, elliptical, or any other suitable shape. The shapes and dimensions shown in FIGS. 3, 5, and 7 and described below are provided only as examples and other openings with different shapes or dimensions may be used for receiving various configuration (shape, size, bend radius, diameter) retaining fingers, without departing from the scope of the embodiments.

Figure 2:
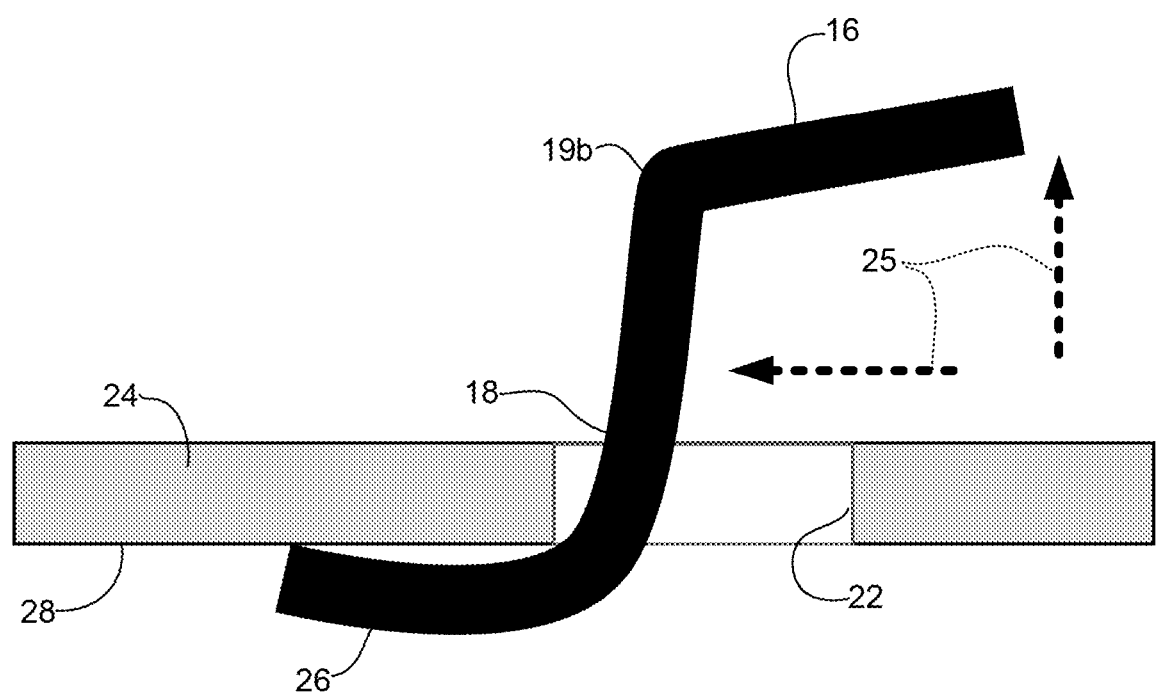
FIG. 2 is a cross-sectional partial side view of a hold down clip of the heat sink hold down system of FIG. 1 attached to a printed circuit board, in accordance with one embodiment.
Figure 3:
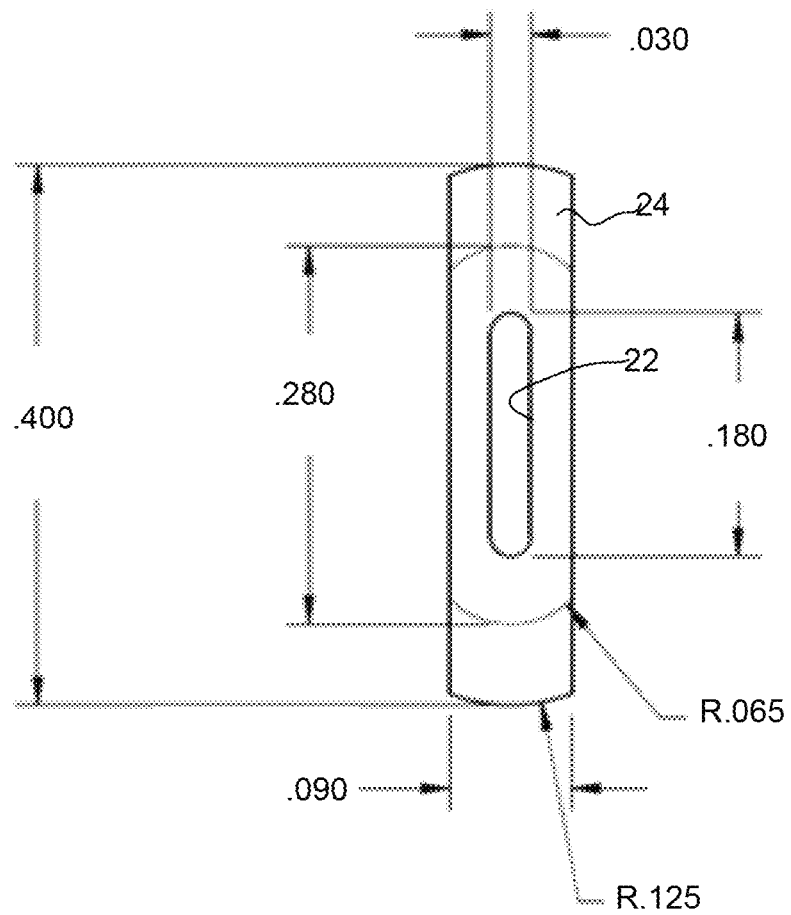
FIG. 3 is a top view of one example of an opening formed in the printed circuit board for receiving the hold down clip of FIG. 2.

FIG. 2 is a cross-sectional partial side view of the resilient arm 16 and retaining finger 18 of the hold down clip 15 of FIG. 1A inserted into opening 22 in printed circuit board 24.

In the example shown in FIG. 2, the retaining finger 18 extends downward from arm 16 at bend 19b at an angle slightly greater than ninety degrees (with the hold down clip 15 in its compressed, spring loaded state) and forms a general L-shape with a tip portion 26 engaging a lower surface 28 of the printed circuit board 24. As indicated by arrows 25 in FIG. 2, the arm 16 and retaining finger 18 are spring loaded to exert a spring force at one or more contact points, edges, or surfaces of the opening 22 and lower surface 28 of the printed circuit board 24 to securely hold down the heat sink 10 on the printed circuit board 24 (FIGS. 1B and 2). More specifically, the retaining finger 26 is spring loaded to exert a radial force against an inner surface (lower edge) of the opening 22 and an upward force against the lower surface 28 of the printed circuit board 24.

The retaining finger 18 is sized for insertion into the opening 22 and may be flattened if needed to fit within the opening. For example, the hold down clip wire may be cold-formed to fit within a 0.030 inch width slot 22 (FIGS. 2 and 3). In one example, the tip portion 26 has a length of 0.170 inch for insertion into an opening sized as shown in FIG. 3.

FIG. 3 illustrates an example of the opening 22 in the printed circuit board 24 shown in FIG. 2. In this example, the opening 22 comprises a slot having a length of 0.180 inch and a width of 0.030 inch. A 0.280 inch length region shown in FIG. 3 surrounding the opening 22 designates a plated area or insert for structural support. The larger area that is 0.400 inch in length in FIG. 3 is a "keep out" area where traces or other electrical components should not be located in the printed circuit board 24.

Figure 4:
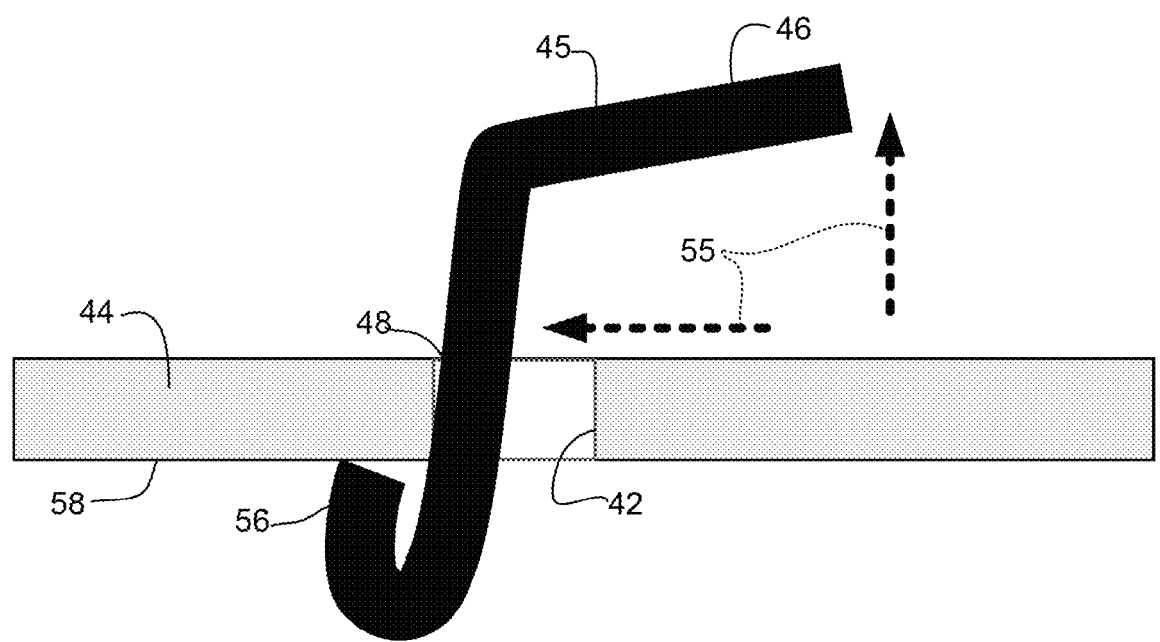
FIG. 4 is a cross-sectional partial side view of another example of a hold down clip attached to a printed circuit board.
Figure 5:
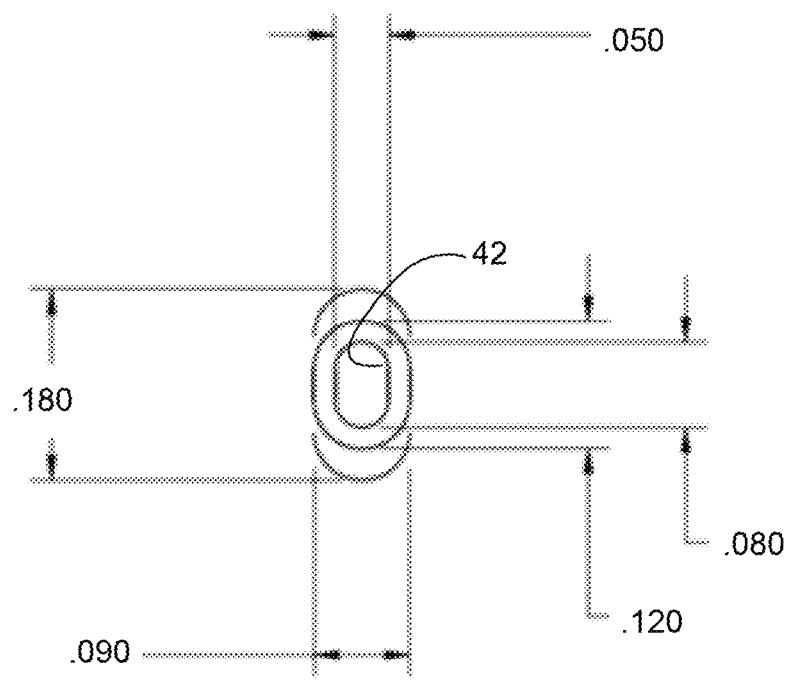
FIG. 5 is a top view of one example of an opening formed in the printed circuit board for receiving the hold down clip of FIG. 4.

FIG. 4 is a cross-sectional partial side view of another example of a hold down clip 45 for insertion into an opening 42 in a printed circuit board 44. In this example, a retaining finger 48 extends downward from arm 46 and forms a J-shape member for hooking onto a lower surface 58 of the printed circuit board 44 in its spring loaded position. The shape of the hold down clip 45 provides a spring retaining force in both a longitudinal direction along the length of the printed circuit board 44 and an upward direction that pulls a tip portion 56 of the retaining member up against the lower surface 58 of the printed circuit board 44. As indicated at arrows 55 in FIG. 4, the retaining finger 48 exerts a radial spring force against an inner surface of the opening 42 and the tip portion 56 exerts an upward force on the lower surface 58 of the printed circuit board 44. The retaining finger 48 may be configured to fit within the opening 42 having dimensions as shown in FIG. 5, for example.

FIG. 5 illustrates an example of the opening 42 in the printed circuit board 44 shown in FIG. 4. In this example, the opening 42 has a length of 0.080 inch and a width of 0.050 inch. A "keep-out" area is also shown for the opening 42 in FIG. 5. The larger width of the opening 42 in FIG. 5 (as compared to the opening 22 in FIG. 3) may provide space for a larger diameter (or constant diameter) wire to pass therethrough. The hold down clip 45 in FIG. 4 is designed to mount the heat sink 10 using a smaller length opening in the printed circuit board to reduce space required for heat sink attachment on the printed circuit board 44. The opening 42 of FIG. 5 may be used to reduce the overall footprint of the opening and corresponding insert/keep out region as compared to the opening 22 shown in FIG. 3.

Figure 6:
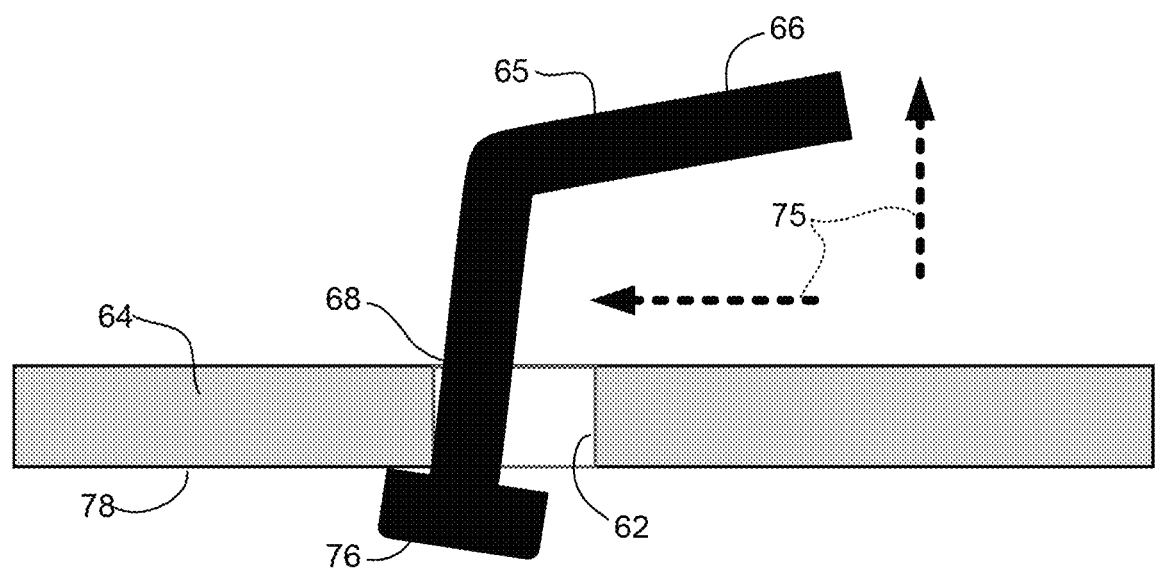
FIG. 6 is a cross-sectional partial side view of another example of a hold down clip attached to a printed circuit board.
Figure 7:
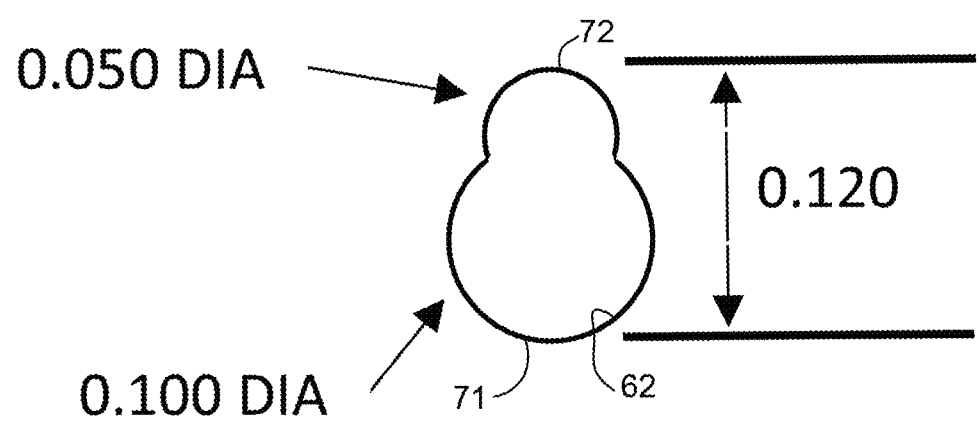
FIG. 7 is a top view of one example of an opening formed in the printed circuit board for receiving the hold down clip of FIG. 6.

FIG. 6 is a cross-sectional partial side view of another example of a hold down clip 65. In this example, a retaining finger 68 extends downward from resilient arm 66 and comprises a pin head shaped tip 76. The pin head 76 is inserted into opening 62 of circuit board 64, and upon release of the clip 65, the retaining finger 68 springs outward, thus positioning the pin head 76 below a portion of the opening 62 having a diameter smaller than the pin head, with the pin head exerting a force on a lower surface 78 of the printed circuit board 64. As previously described, the spring loaded hold down clip 65 exerts spring forces against an inner surface of the opening 62 in the printed circuit board 64 and upward against lower surface 78, as indicated by arrows 75 in FIG. 6.

FIG. 7 illustrates an example of the opening 62 for receiving the hold down clip 65 shown in FIG. 6. The opening 62 comprises a first portion 71 having a diameter (e.g., 0.100 inch) sufficiently large for receiving the pin head 76 (e.g., 0.095 inch diameter pin head) and a second portion 72 having a diameter (e.g., 0.050) smaller than the pin head to prevent the pin head from passing through the smaller diameter opening when it moves to its spring loaded position after insertion into the opening 62. The pin head 76 may be removed from the opening 62 by compressing the arm 66 to move the pin head in-line with the larger diameter opening 71.

It is to be understood that the shapes and sizes of the hold down clips and corresponding openings within the printed circuit board shown and described herein are only examples and that other configurations, shapes, and sizes may be used for the hold down clip and opening to attach and securely hold down the heat sink on the printed circuit board, without departing from the scope of the embodiments.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus for holding down a heat sink on a printed circuit board, the apparatus comprising:
   a pair of hold down clips, each of the hold down clips comprising:
      a first end for attachment to a first corner of the heat sink;
      a resiliently compressible arm for extending along a majority of a length of the heat sink adjacent to fins of the heat sink; and
      a retaining finger at a second end of the hold down clip for insertion into an opening in the printed circuit board adjacent to a second corner of the heat sink;
   wherein the retaining finger is configured to exert a spring force against a lower surface of the printed circuit board when inserted into said opening to securely hold down the heat sink on an upper surface of the printed circuit board.

2. The apparatus of claim 1 wherein the pair of hold down clips are configured for attachment to opposite corners of the heat sink and insertion into said openings located adjacent to remaining opposite corners of the heat sink.

3. The apparatus of claim 1 wherein the hold down clips comprise wires.

4. The apparatus of claim 1 wherein the resiliently compressible arm is formed from a wire having a generally round cross section and the retaining finger is formed from a flattened wire.

5. The apparatus of claim 1 wherein the retaining finger comprises an L-shaped member.

6. The apparatus of claim 1 wherein the retaining finger comprises a J-shaped member.

7. The apparatus of claim 1 wherein the retaining finger comprises a pin head.

8. The apparatus of claim 7 wherein said opening comprises intersecting circles having different diameters.

9. The apparatus of claim 1 wherein said opening comprises a slot.

10. An apparatus comprising:
    a heat sink; and
    a hold down clip comprising:
       a first end attached to the heat sink;
       a resiliently compressible arm extending along a majority of a length of the heat sink adjacent to fins of the heat sink;
       and a retaining finger at a second end for insertion into an opening in a printed circuit board;
    wherein the hold down clip is resiliently compressible for insertion into said opening in the printed circuit board and configured to exert a spring force against a lower surface of the printed circuit board when inserted into said opening to hold down the heat sink on an upper surface of the printed circuit board.

11. The apparatus of claim 10 wherein the hold down clip comprises a pair of hold down clips configured for attachment to opposite corners of the heat sink and insertion into openings located adjacent to remaining opposite corners of the heat sink.

12. The apparatus of claim 10 wherein the hold down clip comprises a wire.

13. The apparatus of claim 10 wherein the resiliently compressible arm is formed from a wire having a generally round cross section and a retaining finger is formed from a flattened wire for insertion into said opening.

14. The apparatus of claim 10 wherein the retaining finger comprises an L-shaped member.

15. The apparatus of claim 10 wherein the retaining finger comprises a J-shaped member.

16. The apparatus of claim 10 wherein the retaining finger comprises a pin head.

17. A system comprising:
    a printed circuit board comprising at least one opening extending therethrough;
    a heat sink; and
    a hold down clip comprising:
       a first end for attachment to the heat sink;
       a resiliently compressible arm extending along a majority of a length of the heat sink adjacent to fins of the heat sink; and
       a retaining finger at a second end for insertion into said opening in the printed circuit board;
    wherein the hold down clip is resiliently compressible for insertion into said opening in the printed circuit board and exerts a spring force against a lower surface of the printed circuit board when inserted into said opening to hold down the heat sink on an upper surface of the printed circuit board.

18. The system of claim 17 wherein the hold down clip comprises a pair of hold down clips attached to opposite corners of the heat sink and inserted into openings located adjacent to remaining opposite corners of the heat sink and wherein at least one electronic component is interposed between the printed circuit board and the heat sink.

19. The system of claim 17 wherein the hold down clip comprises a continuous wire compressible between said first attached end and said second end for insertion into said opening.

20. The system of claim 17 wherein the retaining finger comprises an L-shaped member.

\* \* \* \* \*